United States Patent [19]

Grabbe

[11] 4,445,271
[45] * May 1, 1984

[54] CERAMIC CHIP CARRIER WITH REMOVABLE LEAD FRAME SUPPORT AND PREFORATED GROUND PAD

[75] Inventor: Dimitry G. Grabbe, Lisbon Falls, Me.

[73] Assignee: AMP Incorporated, Harrisburg, Pa.

[*] Notice: The portion of the term of this patent subsequent to Dec. 7, 1999 has been disclaimed.

[21] Appl. No.: 293,023

[22] Filed: Aug. 14, 1981

[51] Int. Cl.³ .................... H01L 23/50; H01L 23/48; H05K 5/02

[52] U.S. Cl. ........................................ 29/589; 29/588; 29/577 C; 29/827; 357/70; 174/52 FP

[58] Field of Search ................. 29/588, 589, 577, 571, 29/827; 357/70; 174/52 R, 52 FP

[56] References Cited

U.S. PATENT DOCUMENTS

| | | | |
|---|---|---|---|
| 3,723,833 | 3/1973 | Wheatley | 357/28 |
| 3,802,069 | 4/1974 | Thompson | 29/827 |
| 4,012,766 | 3/1977 | Phillips et al. | 357/70 |
| 4,105,861 | 8/1978 | Hascoe | 174/52 FP |
| 4,137,546 | 1/1979 | Frusco | 357/70 |
| 4,141,712 | 2/1979 | Rogers | 65/36 |
| 4,195,193 | 3/1980 | Grabbe et al. | 174/52 FP |
| 4,218,701 | 8/1980 | Shirasaki | 29/588 X |
| 4,289,922 | 9/1981 | Devlin | 357/70 X |
| 4,301,464 | 11/1981 | Otsuki et al. | 357/70 |
| 4,312,926 | 1/1982 | Burns | 357/70 X |
| 4,362,902 | 12/1982 | Grabbe | 29/827 X |
| 4,380,042 | 4/1983 | Angelucci et al. | 357/70 X |

Primary Examiner—Brain E. Hearn
Assistant Examiner—David A. Hey

[57] ABSTRACT

A ceramic chip carrier having a lead frame thereon with a removable lead frame support which does not bond to the ceramic during the bonding procedure and is later removed. A perforated ground pad is bonded to the substrate simultaneously with the leads of the lead frame and is attached to the lead frame support. The support area is of reduced thickness relative to the rest of the lead frame so that it does not come in contact with the ceramic substrate during the bonding procedure. After firing and bonding of the lead frame to the substrate, the unbonded support rim is removed by pinch cutting, etching or the like.

2 Claims, 5 Drawing Figures

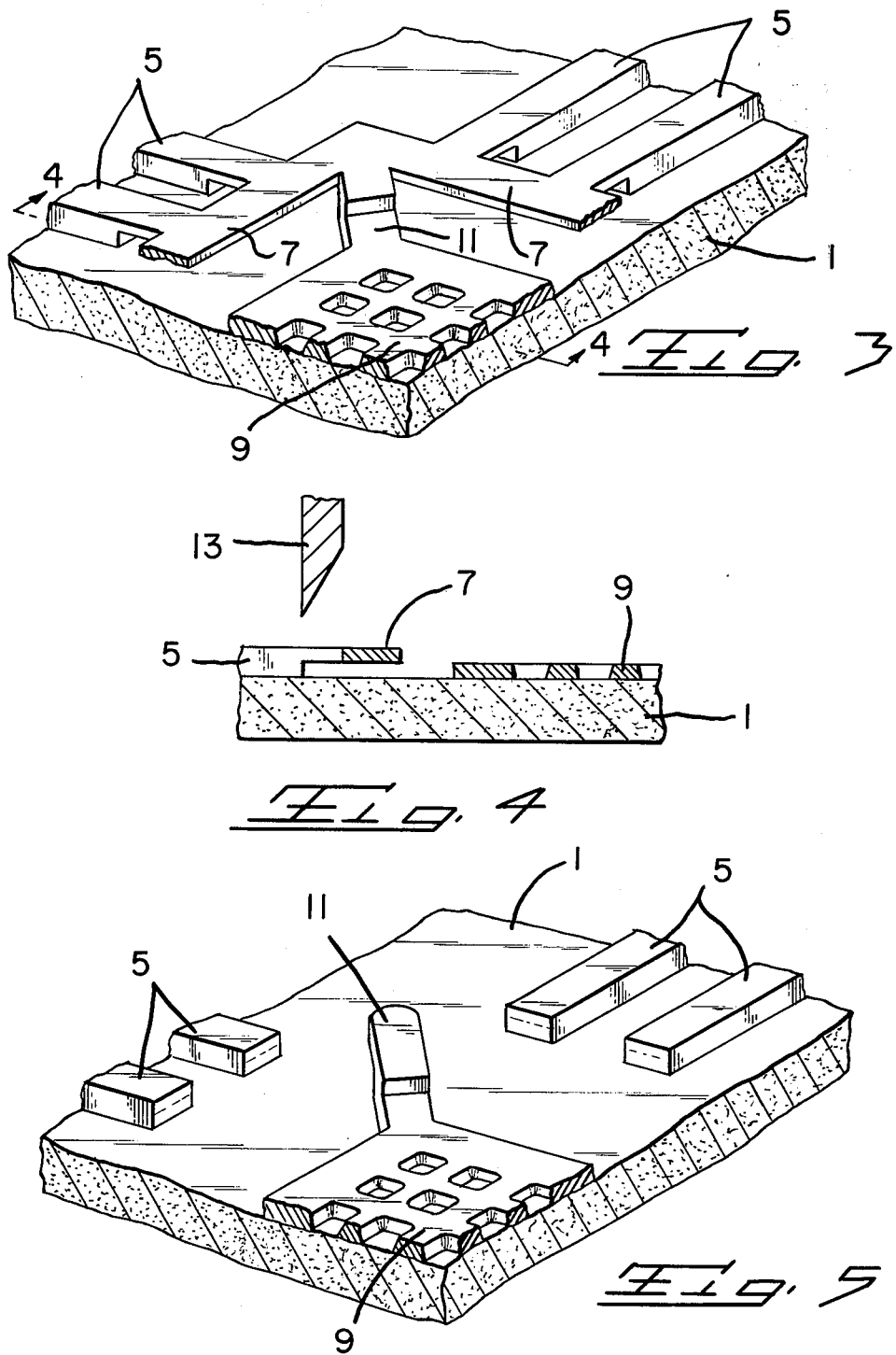

CERAMIC CHIP CARRIER WITH REMOVABLE LEAD FRAME SUPPORT AND PREFORATED GROUND PAD

BACKGROUND OF THE INVENTION

1. Field of the Invention

This invention relates to a process for accurately positioning a lead frame onto a ceramic chip carrier to permit wire bonding to the lead frame by means of automatic wire bonding machinery and also relates to the formation of a grounding pad positioned beneath the chip which is bonded simultaneously with the leads of the lead frame and is capable of passing gases therethrough during the bonding procedure.

2. Description of the Prior Art

In the formation of ceramic chip carriers, lead frames are normally bonded to the ceramic substrate with subsequent connections being made to the leads of the lead frame from appropriate pads on semiconductor chips secured to the ceramic substrate. These connections from the pads on the chip to the leads of the lead frame are made manually or by means of automatic wire bonding machinery or by mass-bonding techniques using "spider" tape. The automatic wire bonding machinery is normally computer operated on an x-y coordinate basis and it is therefore necessary that the leads of the lead frame be accurately positioned on the substrate so that wiring which is run from pads on the semiconductor chip to the appropriate lead on the lead frame.

In accrdance with some of the prior art, the entire lead frame was bonded to the ceramic substrate by well-known methods and the portions of the leads closely adjacent to the semiconductor device to which wire bonding was to take place would move relative to the semiconductor pads during the process of bonding the lead frame to the ceramic substrate. It is therefore readily apparent that the automatic wire bonding machines cannot be used with the types of prior art combinations of substrate and lead frame because bonding from appropriate pads of the semiconductor devices to the appropriate leads of the lead frame cannot be definitely predicted. It is therefore necessary that a lead frame be bonded to a ceramic substrate wherein the leads of the lead frame are accurately positioned on the substrate and maintain their position during and after the procedure of bonding the lead frame to the substrate. It is also desirable that ground pads be provided in the event ground potential is to be provided to the bottom surface of the semiconductor chip wherein the ground pad can remain securely bonded to the substrate.

SUMMARY OF THE INVENTION

In accordance with the present invention, there is provided a chip carrier having a lead frame thereon wherein the ends of each of the inner lead portions are closely adjacent to the semiconductor device to which the leads are to be bonded, the semiconductor device being positioned on a ground pad formed at the rear of the leads. The lead frame is formed with the ends of the inner leads temporarily connected to a common support to which the ground pad is also connected. The support is removed after bonding of the lead frame and ground to the ceramic substrate. This provides accurate and constant spacing between the leads of the lead frame during bonding of the lead frame to the ceramic substrate. The ground pad is in the form of a grid capable of passing gases therethrough which may form during the bonding process.

The lead frame is formed perferably of copper or a copper surfaced metal and is oxidized on the surface adjacent the ceramic substrate. The lead frame is then bonded to the ceramic substrate by forming a bond between the copper oxide and ceramic by the procedure described in the patents of Burgess et al (U.S. Pat. No. 3,744,120), Babcock et al (U.S. Pat. No. 3,766,634), Burgess et al (U.S. Pat. No. 3,854,892), Burgess et al (U.S. Pat. No. 3,911,553), Cusano et al (U.S. Pat. No. 3,994,430), Cusano et al (U.S. Pat. No. 4,129,243). The term "direct bond" as used herein will be understood to mean a bond achieved according to the teachings of the above-cited patents. After firing and bonding of the lead frame to the substrate, the unbonded support rim which is of reduced thickness relative to the rest of the lead frame, is removed by pinch cutting, etching or the like.

BRIEF DESCRIPTION OF THE DRAWINGS

FIG. 3 is an enlarged view of a portion of the embodiment shown in FIG. 1.

FIG. 4 is a cross-sectional view of the embodiment as in FIG. 3 taken along the line 4-4 of FIG. 3 showing a cutting edge position to cut the support.

FIG. 5 is an enlarged view of a portion of the embodiment as shown in FIG. 3

DETAILED DESCRIPTION OF THE PREFERRED EMBODIMENT

Figure 1:
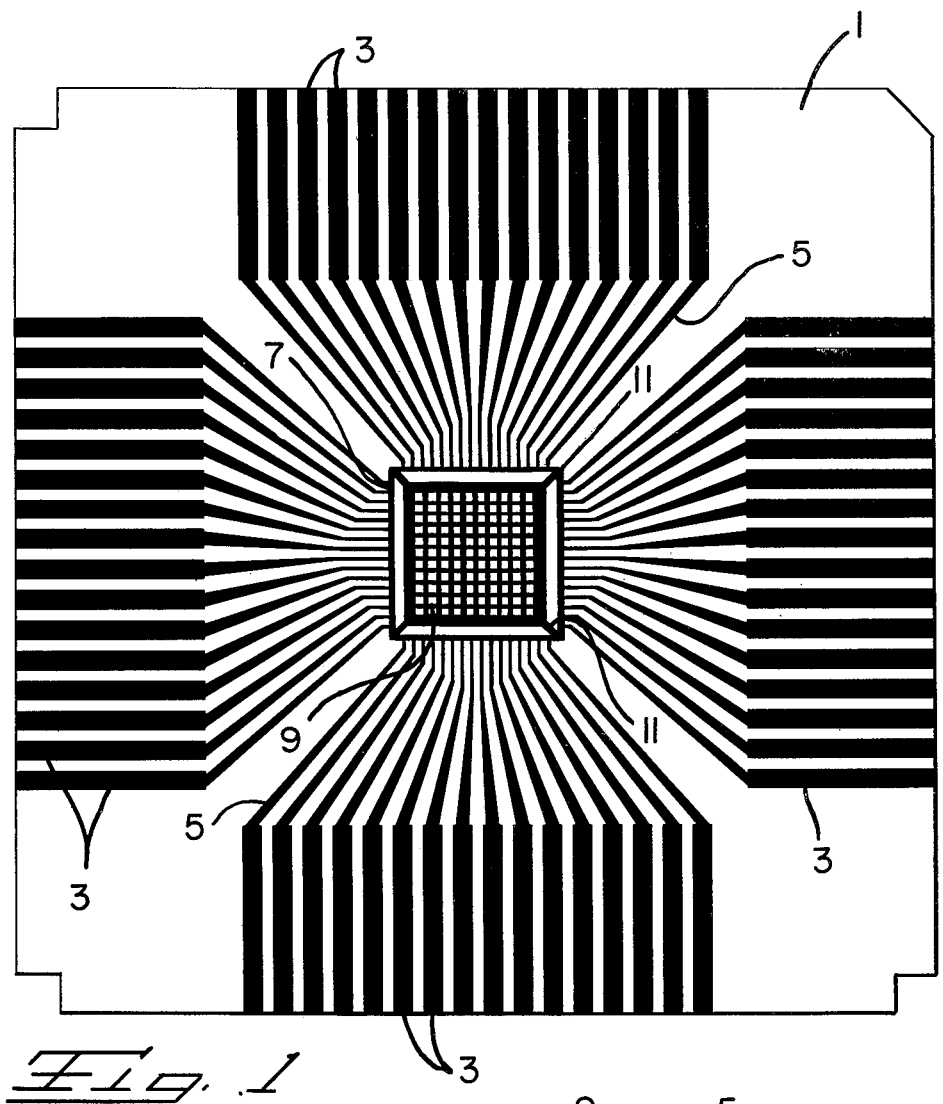
FIG. 1 is a top view of a semiconductor chip carrier including a ceramic substrate having a lead frame and a ground pad bonded thereto, the lead frame having a support at the internal region thereof.

Referring first to FIGS. 1 and 3, there is shown a ceramic substrate 1 which is formed of alumina, berylia or other ceramic of appropriate materials. Positioned on the substrate 1 is a lead frame composed of a plurality of pads 3 connected to leads 5. A support 7 is connected to the inner edges of each of the leads 5 and supports the leads 5 in the desired position as originally formed by stamping or the like. A ground pad 9 in the form of a grid is connected to the support 7 by means of tabs 11. The support 7 is elevated from the substrate 1 and is not in contact therewith due to the reduced thickness of the support region 7. This region is preferably one half the thickness of the remainder of the lead frame. The lead frame and grounding pad 9 are preferably formed of copper or copper surfaced metal and are bonded to the ceramic substrate 1 by the procedure set forth in the patents noted above. As stated above, the support 7 will not bond to the substrate 1 due to its elevated position as shown in FIG. 3.

Figure 2:
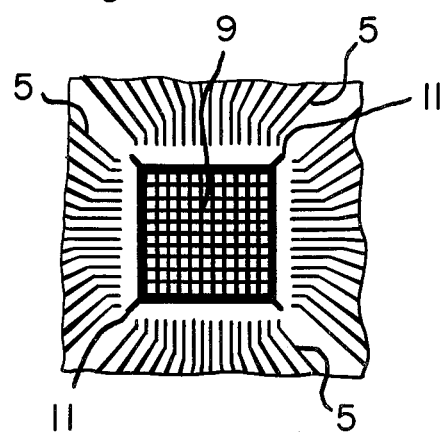
FIG. 2 is a view as in FIG. 1 with the support removed.

Referring now to FIG. 4, there is shown a cutting tool 13 which will cut the support 7 at each of its points of attachment to the leads 5 and the tabs 11. The resulting lead frame will be as shown in FIGS. 2 and 5, FIG. 5 being a view identical to that of FIG. 3 but with the support 7 removed.

Though the thickness of the support 7 has been stated to be about one half the thickness of the remainder of the lead frame, this thickness can actually be determined by the dimensions of the lead frame involved. As a practical matter, the thickness of the support 7 must be such that it will not sag sufficiently during the bonding pocedure to come in contact with the ceramic substrate 1.

The ground pad 9 is in the form of a grid and includes perforations therein for passage of gases. These gases can form during the procedure of bonding of the copper oxide surface on the lead frame and ground pad to the ceramic substrate as described in the above identified patents. This passage of gas through the grid will prevent the formation of blisters in the ground pad area.

It can be seen that there has been provided a method whereby lead frames can be positioned on ceramic substrates with the leads of the lead frame retaining their position relative to the substrate without movement during the bonding operation and wherein a ground pad can be formed simultaneously with the formation of the lead frame without blistering.

Though the invention has been described with respect to a specific preferred embodiment thereof, many variations and modifications will immediately become apparent to those skilled in the art. It is therefore the intention that the appended claims be interpreted as broadly as possible in view of the prior art to include all such variations and modifications.

I claim:
1. A method of manufacturing a ceramic chip carrier comprising the steps of:
    (a) providing a planar ceramic substrate;
    (b) providing a planar copper-surfaced lead frame having a plurality of leads connected at the interior thereof by a copper-surfaced support rim coplanar with said lead frame, said rim being of a thickness less than said lead frame;
    (c) providing a planar copper-surfaced ground pad within said support rim and connected thereto, said pad being coplanar with said lead frame, said pad having perforations therethrough;
    (d) disposing said lead frame and said pad against said ceramic substrate with a layer of copper oxide at the interface, said rim being in non-contacting relation with said substrate;
    (e) direct bonding said lead frame and pad to said substrate.
2. A method as set forth in claim 1 further including the step of removing said support rim.

* * * * *